United States Patent [19]
Hashimoto

[11] Patent Number: 6,087,675
[45] Date of Patent: Jul. 11, 2000

[54] SEMICONDUCTOR DEVICE WITH AN INSULATION FILM HAVING EMITTER CONTACT WINDOWS FILLED WITH POLYSILICON FILM

[75] Inventor: Takasuke Hashimoto, Tokyo, Japan

[73] Assignee: NEC Corporation, Tokyo, Japan

[21] Appl. No.: 09/069,543

[22] Filed: Apr. 30, 1998

[30] Foreign Application Priority Data

Apr. 30, 1997 [JP] Japan ................................. 9-112068

[51] Int. Cl.$^7$ ................................................. H01L 27/082
[52] U.S. Cl. ........................... 257/48; 257/563; 257/579; 257/584; 257/587; 257/588
[58] Field of Search .................... 324/768, 756; 257/48, 573, 587, 563, 579, 584, 588

[56] References Cited

U.S. PATENT DOCUMENTS

| | | | |
|---|---|---|---|
| 3,444,443 | 5/1969 | Moroshima | 317/235 |
| 3,576,476 | 4/1971 | Kerr | 317/235 |
| 3,582,723 | 6/1971 | Kerr | 317/235 |
| 3,704,398 | 11/1972 | Fukino | 317/235 R |
| 3,895,977 | 7/1975 | Sanders | 148/187 |
| 4,079,505 | 3/1978 | Hirano et al. | 29/574 |
| 4,291,319 | 9/1981 | Carinalli | 357/13 |
| 5,005,071 | 4/1991 | Amano | 357/85 |
| 5,510,652 | 4/1996 | Burke et al. | 257/752 |

FOREIGN PATENT DOCUMENTS

| | | |
|---|---|---|
| 58-58760 | 4/1983 | Japan . |
| 3-253033 | 11/1991 | Japan . |
| 7-135241 | 5/1995 | Japan . |
| 10-303215 | 11/1998 | Japan . |

OTHER PUBLICATIONS

Japanese Office Action dated Sep. 22, 1999 with Partial Translation.

*Primary Examiner*—Jerome Jackson, Jr.
*Assistant Examiner*—Bradley William Baumeister
*Attorney, Agent, or Firm*—McGinn & Gibb, P.C.

[57] ABSTRACT

The present invention relates to a contact window structure having an insulation layer extending over an electrically conductive region. The insulation layer further has a plurality of contact windows which are filled with electrically conductive layers so that the electrically conductive layers are made into contact with the electrically conductive region so as to allow a contact portion of a probe to contact with at least one of the electrically conductive layers within the contact windows, wherein adjacent two of the contact windows are distanced from each other by a distance which is substantially equal to or narrower than a diameter of the contact portion of the probe, whereby the contact portion of the probe is necessarily made into contact with at least any one of the electrically conductive layers within the contact windows. There is no possibility that the contact portion of the probe is not made into contact with any electrically conductive layers. Namely, the above contact window structure allows a certain contact of the contact portion of the probe with the conductive layers which are electrically connected to the semiconductor regions.

18 Claims, 26 Drawing Sheets

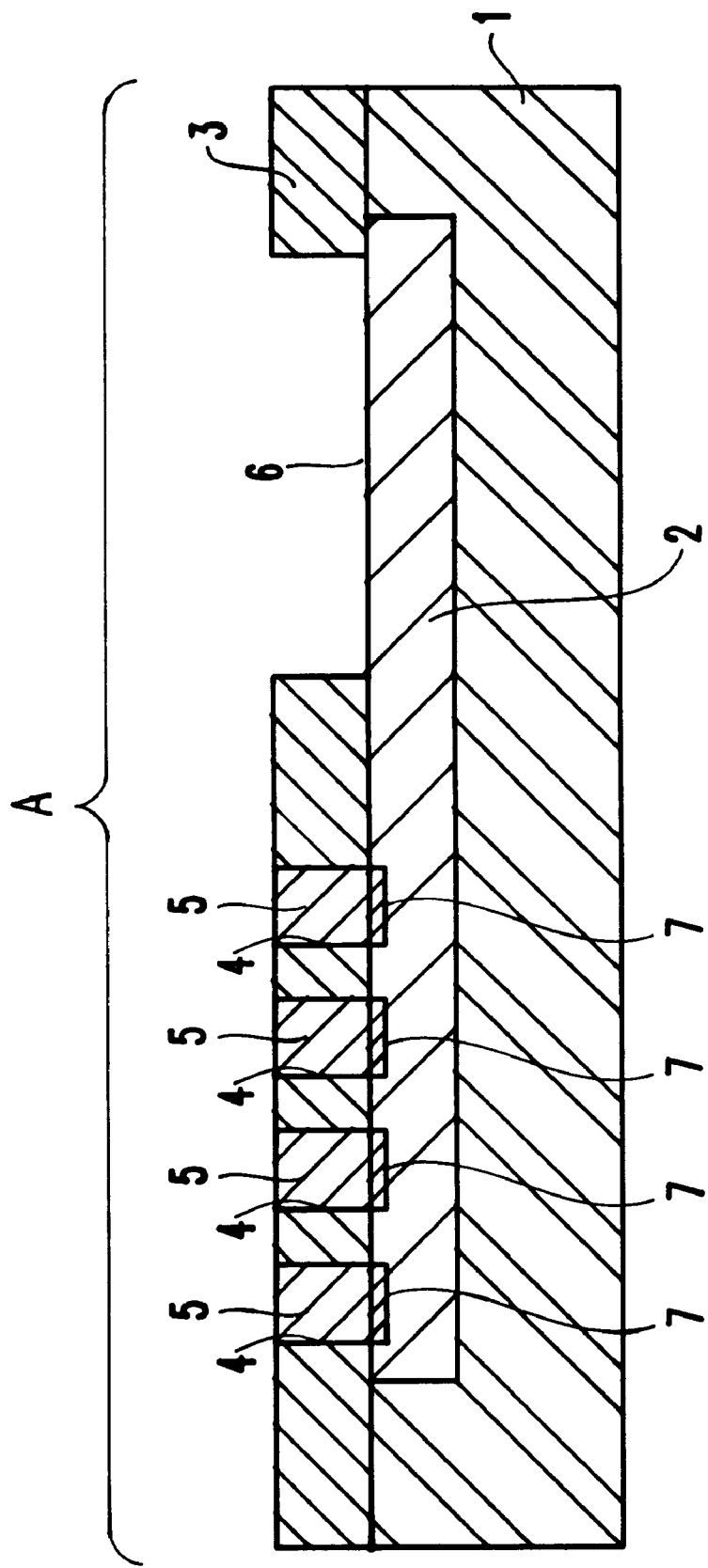

SEMICONDUCTOR DEVICE WITH AN INSULATION FILM HAVING EMITTER CONTACT WINDOWS FILLED WITH POLYSILICON FILM

BACKGROUND OF THE INVENTION

The present invention relates to a semiconductor device, and more particularly to a semiconductor device with an insulation film having emitter contact windows filled with polysilicon films.

It has been known in the art to which the invention pertains that, in order to form a shallow emitter-base junction of a bipolar transistor, a polysilicon film having contained an impurity is formed on a base region for subsequent impurity diffusion into selected parts of the base region so that emitter regions having the diffused impurity are selectively formed in the base region. The above impurity doped polysilicon film is formed over an inter-layer insulator and also within emitter contact windows having been formed in the inter-layer insulator and positioned over an emitter-formation region in the base region. Since the emitter-base contact is formed in fine pattern, it is required to provide a check region for allowing required check of device characteristics and performances during the manufacturing process.

One of conventional emitter contact window structures for allowing required check of device characteristics and performances during the manufacturing process is disclosed in Japanese laid-open patent publication No. 58-58760. Descriptions of the conventional emitter contact window structure of the semiconductor device will be made with reference to FIGS. 1A and 1B. FIG. 1A is a fragmentary plane view illustrative of a semiconductor device having the conventional emitter contact window structure. FIG. 1B is a fragmentary cross sectional elevation view illustrative of a semiconductor device having the conventional emitter contact window structure taken along an "c—c" line of FIG. 1A. Probes are made into contact with a polysilicon layer 5 and a base contact window for checking various characteristics of the semiconductor device such as high voltage performances and current amplification coefficient thereof during a diffusion process before metal electrodes will be provided. Each of emitter contact windows 4 is formed in slit-shape which has the same width as a width of an emitter region which is intended to practically serve as emitter of the bipolar transistor. The emitter contact windows 4 are to allow checking the various device characteristics. Emitters are formed under the emitter contact windows 4 for allowing the required checking of the device characteristics. Since the emitter contact windows 4 have the same width as the width of the actually serving emitter region, then the emitter-base junction formed on the check region has the same in curvature and in emitter injection efficiency as the emitter-base junction formed in the device region. This results in a reduction in relative variation in properties between the check pattern and the device portion. This allows the characteristics of the device to be accurately controllable.

The above first conventional emitter contact window structure is, however, engaged with a problem with limitations for scaling down to the semiconductor device and to increase the integration of the semiconductor device.

It has also been proposed that the impurity doped polysilicon film is formed to be filled within emitter contact windows having been formed in an inter-layer insulator but not extends over the inter-layer insulator. This conventional technique is disclosed in Japanese laid-open patent publication No. 3-253033. This second conventional structure allows a narrow distance between the emitter-base junction and the base-collector junction. This second conventional structure is, therefore, capable of settlement of the above problem with the limitations to scaling down of the semiconductor device and to increase the integration of the semiconductor device. Fabrication processes for a semiconductor device with the second conventional structure will be described. FIGS. 1A through 2F are fragmentary cross sectional elevation views illustrative of semiconductor devices with the second conventional emitter contact window structure in sequential steps involved in a conventional fabrication method.

With reference to FIG. 2A, a silicon substrate has a check region "A" and a device region "B". Base regions 2 are formed in selected upper regions of the silicon substrate 1. An insulation film 3 is formed which entirely extends over the silicon substrate 1 and the base regions 2. A reactive ion etching is carried out by use of a resin film as a mask for selectively forming emitter-contact windows 4 and base contact windows 8 in the insulation film 3. Subsequently, a polysilicon film 5 is deposited entirely over the surface of the substrate so that the polysilicon film 5 extends over the base regions 2 and the insulation film 3. During the growth of the polysilicon film 5, an impurity is introduced into the polysilicon film 5. A resin film 9 is further formed over the polysilicon film 5. A spin-on-glass film 10 is entirely formed over the resin film 9. A resin film 11 is selectively formed on the spin-on-glass film 10 on an emitter-formation region in the check region "A".

With reference to FIG. 2B, a reactive ion etching is carried out by use of the resin film 11 as a mask to selectively etch the spin-on-glass film 10.

With reference to FIG. 2C, a reactive ion etching is carried out by use of the spin-on-glass film 10 as a mask to selectively etch the resin film 9 and the polysilicon film 5 so as to leave the resin film 9 over the emitter-formation region in the check region "A" and also leave the polysilicon film 5 within the emitter-contact windows 4 and the base contact windows 8 and also under the spin-on-glass film 10.

With reference to FIG. 2D, the spin-on-glass film 10 is removed by an etchant of diluted fluorine acid solution and subsequently the resin film 9 is removed in an oxygen plasma. A resin film 12 is selectively formed which covers the polysilicon films 5 within the emitter contact window 4. The polysilicon films 5 within the base contact window 8 are removed by use of the resin film 12 as a mask wherein a nitric system solution is used as an etchant.

With reference to FIG. 2E, the resin film 12 is removed in the oxygen plasma before a heat treatment is carried out to cause an impurity diffusion from the polysilicon film 5 remaining within the emitter-contact window 4 into the base region 2 whereby emitter regions 7 are selectively formed within the base region 2.

The above process shown in FIG. 2E can be replaced by a process shown in FIG. 2F.

The above second conventional problem is, however, engaged with a disadvantage in the requirement for additional processes for forming the check regions. Namely, the resin film 11 is selectively formed for allowing the polysilicon film 5 to remain within the emitter contact window 4.

In the above circumstances, it had been required to develop a novel emitter contact window structure for a semiconductor device free from the above problems and disadvantages.

SUMMARY OF THE INVENTION

Accordingly, it is an object of the present invention to provide a novel emitter contact window structure for a semiconductor device free from the above problems.

It is a further object of the present invention to provide a novel emitter contact window structure for a semiconductor device which allows a certain contact of a probe with at least any one of polysilicon layers in emitter-contact windows formed in an insulation layer.

The above and other objects, features and advantages of the present invention will be apparent from the following descriptions.

The present invention relates to a contact window structure having an insulation layer extending over an electrically conductive region. The insulation layer further has a plurality of contact windows which are filled with electrically conductive layers so that the electrically conductive layers are made into contact with the electrically conductive region so as to allow a contact portion of a probe to contact with at least one of the electrically conductive layers within the contact windows, wherein adjacent two of the contact windows are distanced from each other by a distance which is substantially equal to or narrower than a diameter of the contact portion of the probe, whereby the contact portion of the probe is necessarily made into contact with at least any one of the electrically conductive layers within the contact windows. There is no possibility that the contact portion of the probe is not made into contact with any electrically conductive layers. Namely, the above contact window structure allows a certain contact of the contact portion of the probe with the conductive layers which are electrically connected to the semiconductor regions.

BRIEF DESCRIPTION OF THE DRAWINGS

Preferred embodiments according to the present invention will be described in detail with reference to the accompanying drawings.

FIG. 3B is a fragmentary cross sectional elevation view illustrative of a semiconductor device having a novel emitter contact window structure taken along an "a—a" line of FIG. 3A.

DISCLOSURE OF THE INVENTION

Figure 1A:
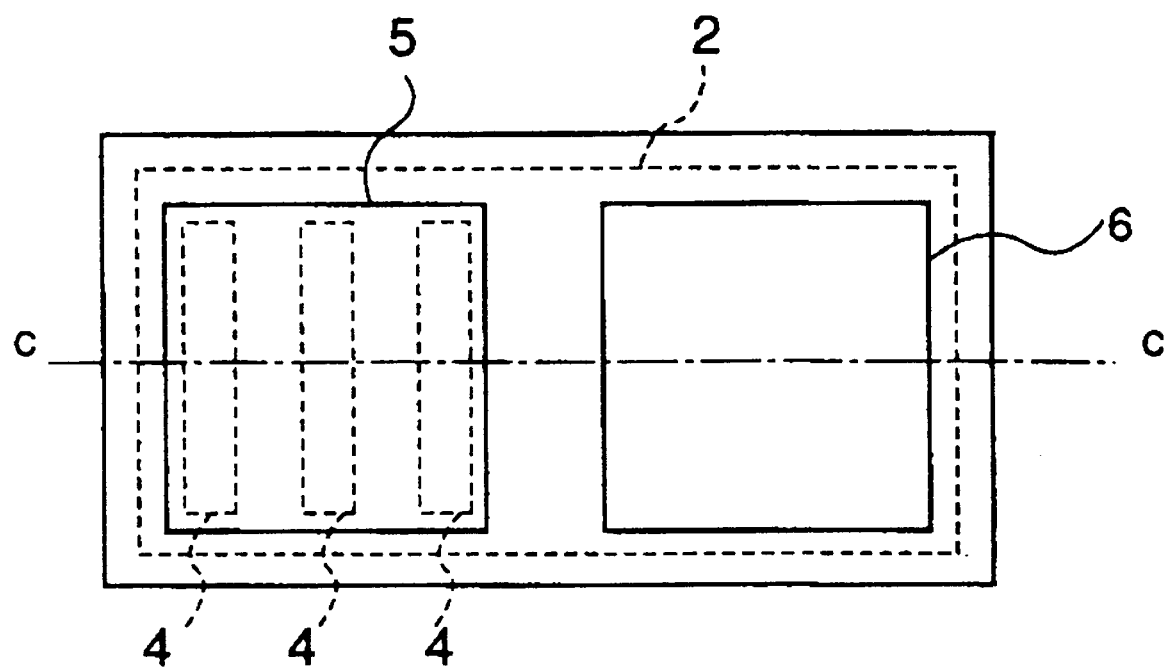
FIG. 1A is a fragmentary plane view illustrative of a semiconductor device having the conventional emitter contact window structure.
Figure 1B:
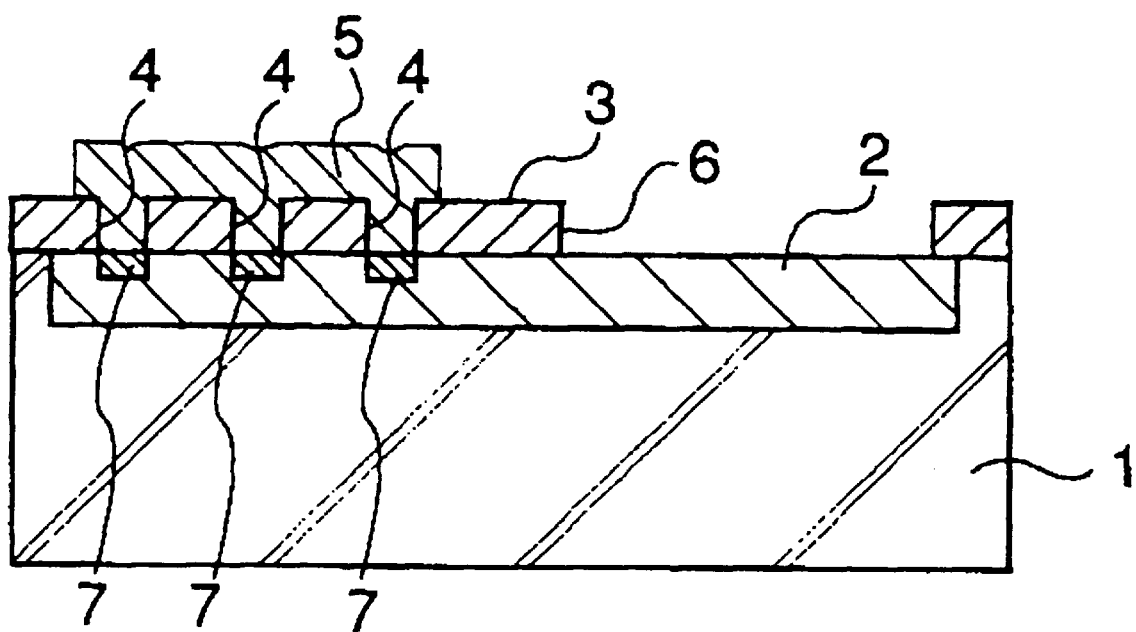
FIG. 1B is a fragmentary cross sectional elevation view illustrative of a semiconductor device having the conventional emitter contact window structure taken along an "c—c" line of FIG. 1A.
Figure 2A:
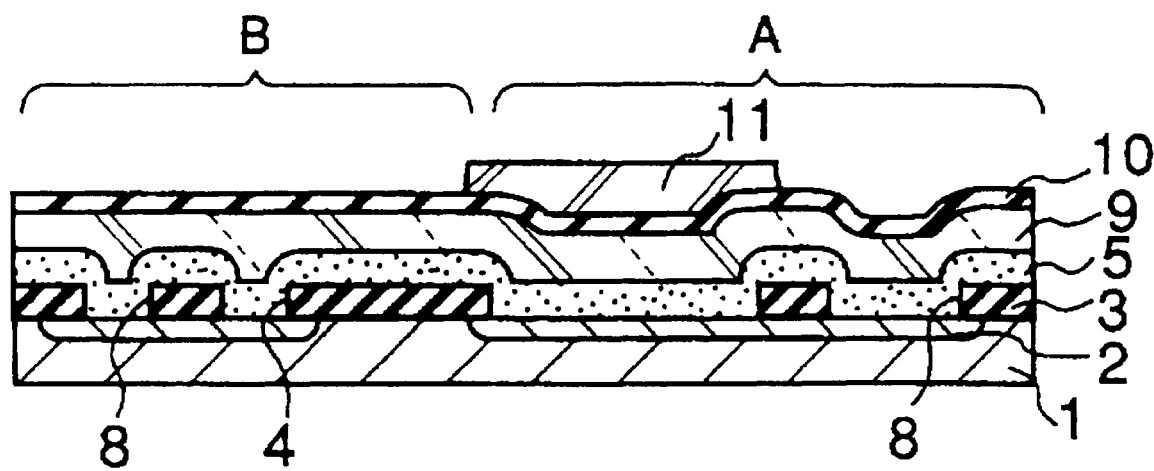
FIGS. 2A through 2F are fragmentary cross sectional elevation views illustrative of semiconductor devices with the second conventional emitter contact window structure in sequential steps involved in a conventional fabrication method.
Figure 2B:
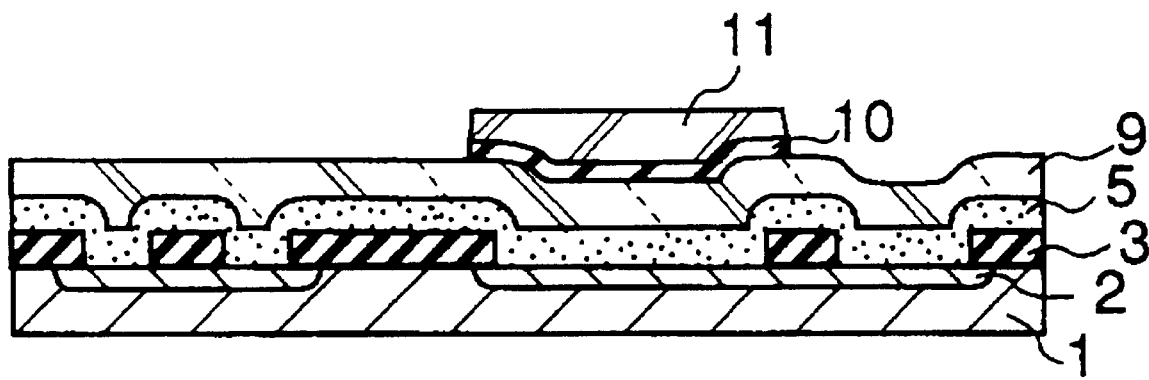
Figure 2C:
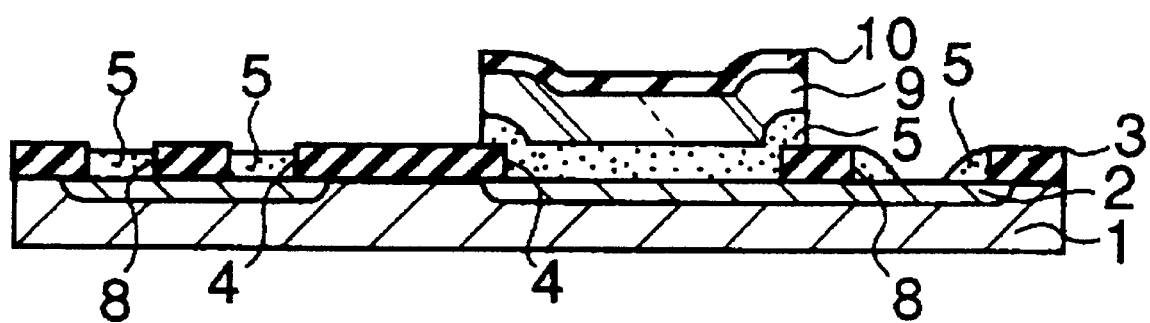
Figure 2D:
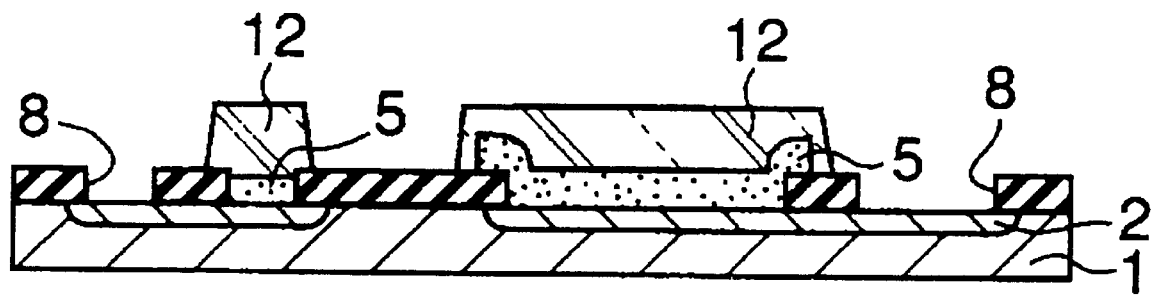
Figure 2E:
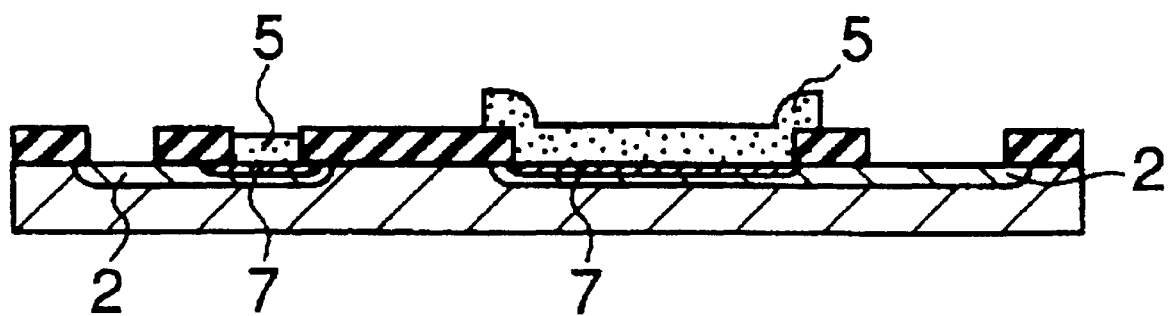
Figure 2F:
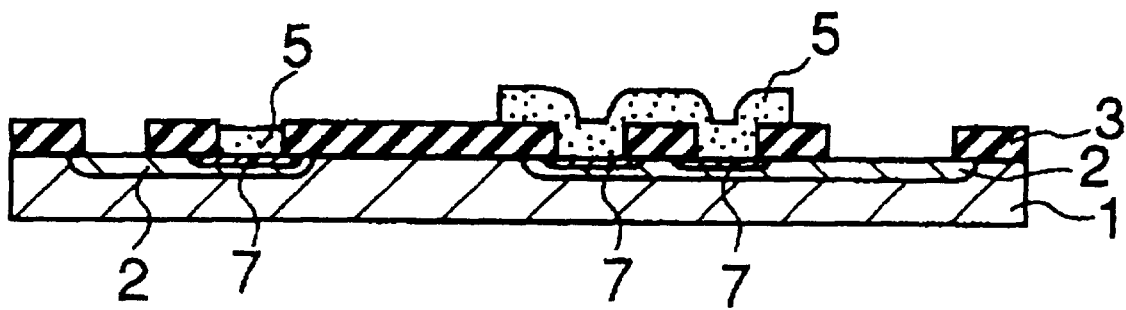

The first present invention relates to a contact window structure having an insulation layer extending over an electrically conductive region. The insulation layer further has a plurality of contact windows which are filled with electrically conductive layers so that the electrically conductive layers are made into contact with the electrically conductive region so as to allow a contact portion of a probe to contact with at least one of the electrically conductive layers within the contact windows, wherein adjacent two of the contact windows are distanced from each other by a distance which is substantially equal to or narrower than a diameter of the contact portion of the probe, whereby the contact portion of the probe is necessarily made into contact with at least any one of the electrically conductive layers within the contact windows. There is no possibility that the contact portion of the probe is not made into contact with any electrically conductive layers. Namely, the above contact window structure allows a certain contact of the contact portion of the probe with the conductive layers which are electrically connected to the semiconductor regions.

It is of course allowed that the above distance between the adjacent two contact windows and the contact window size are decided so that the contact portion of the probe is made into contact with a plurality of the electrically conductive layers within the contact windows.

It is preferable that the contact windows are stripe-shaped and arranged at a pitch which is substantially equal to or narrower than the diameter of the contact portion of the probe.

It is also preferable that the contact windows are rectangular-shaped and aligned in matrix at first and second pitches along first and second directions which are perpendicular to each other and the first and second pitches which are substantially equal to or narrower than the diameter of the contact portion of the probe It is also preferable that the contact windows are square-shaped and aligned in matrix at first and second pitches along first and second directions which are perpendicular to each other and the first and second pitches which are substantially equal to or narrower than the diameter of the contact portion of the probe.

It is also preferable that the distance is not more than 1 micrometers.

It is also preferable that the electrically conductive layers have a top level which lies substantially equal to or higher than a top level of the insulation layer.

It is also preferable that the electrically conductive layers comprise polysilicon layers.

It is also preferable that the electrically conductive layers comprise refractory metal layers.

It is also preferable that the electrically conductive region comprises a semiconductor diffusion region.

It is also preferable that the contact window has a size of not more than 0.6 micrometers.

The second present invention relates to an emitter contact window structure having an insulation layer extending over a base region. The insulation layer further has a check region on which a plurality of emitter contact windows are formed. The emitter contact windows are filled with polysilicon layers so that the polysilicon layers are made into contact with the base region and also that emitter regions are formed at upper portions of the base region in contact with the polysilicon layers, so as to allow a contact portion of a probe to contact with at least one of the polysilicon layers within the emitter contact windows, wherein adjacent two of the contact windows are distanced from each other by a distance which is substantially equal to or narrower than a diameter of the contact portion of the probe, whereby the contact portion of the probe is necessarily made into contact with at least any one of the polysilicon layers within the contact windows. There is no possibility that the contact portion of the probe is not made into contact with any polysilicon layers. Namely, the above contact window structure allows a certain contact of the contact portion of the probe with the polysilicon layers which are electrically connected to the emitter regions.

It is of course allowed that the above distance between the adjacent two contact windows and the contact window size are decided so that the contact portion of the probe is made into contact with a plurality of the electrically conductive layers within the contact windows.

It is preferable that the contact windows are stripe-shaped and arranged at a pitch which is substantially equal to or narrower than the diameter of the contact portion of the probe.

It is also preferable that the contact windows are rectangular-shaped and aligned in matrix at first and second pitches along first and second directions which are perpendicular to each other and the first and second pitches which are substantially equal to or narrower than the diameter of the contact portion of the probe.

It is also preferable that the contact windows are square-shaped and aligned in matrix at first and second pitches along first and second directions which are perpendicular to each other and the first and second pitches which are substantially equal to or narrower than the diameter of the contact portion of the probe.

It is also preferable that the distance is not more than 1 micrometers.

It is also preferable that the electrically conductive layers have a top level which lies substantially equal to or higher than a top level of the insulation layer.

It is also preferable that the contact window has a size of not more than 0.6 micrometers.

The third present invention relates to a semiconductor device comprising: a substrate; a base region selectively formed in the substrate; an insulation layer extending over the substrate and the base region, the insulation layer having a check region which further has a plurality of emitter contact windows; polysilicon layers filled within the emitter contact windows so that the polysilicon layers are made into contact with the base region; and emitter regions formed in the base region so that the emitter regions are made into contact with the polysilicon layers within the emitter contact windows, so as to allow a contact portion of a probe to contact with at least one of the polysilicon layers within the emitter contact windows, wherein adjacent two of the emitter contact windows are distanced from each other by a distance which is substantially equal to or narrower than a diameter of the contact portion of the probe, whereby the contact portion of the probe is necessarily made into contact with at least any one of the polysilicon layers within the contact windows. There is no possibility that the contact portion of the probe is not made into contact with any polysilicon layers. Namely, the above contact window structure allows a certain contact of the contact portion of the probe with the polysilicon layers which are electrically connected to the emitter regions.

It is of course allowed that the above distance between the adjacent two contact windows and the contact window size are decided so that the contact portion of the probe is made into contact with a plurality of the electrically conductive layers within the contact windows.

It is preferable that the contact windows are stripe-shaped and arranged at a pitch which is substantially equal to or narrower than the diameter of the contact portion of the probe.

It is also preferable that the contact windows are rectangular-shaped and aligned in matrix at first and second pitches along first and second directions which are perpendicular to each other and the first and second pitches which are substantially equal to or narrower than the diameter of the contact portion of the probe.

It is also preferable that the contact windows are square-shaped and aligned in matrix at first and second pitches along first and second directions which are perpendicular to each other and the first and second pitches which are substantially equal to or narrower than the diameter of the contact portion of the probe.

It is also preferable that the distance is not more than 1 micrometers.

It is also preferable that the electrically conductive layers have a top level which lies substantially equal to or higher than a top level of the insulation layer.

It is also preferable that the contact window has a size of not more than 0.6 micrometers.

PREFERRED EMBODIMENTS

Figure 3A:
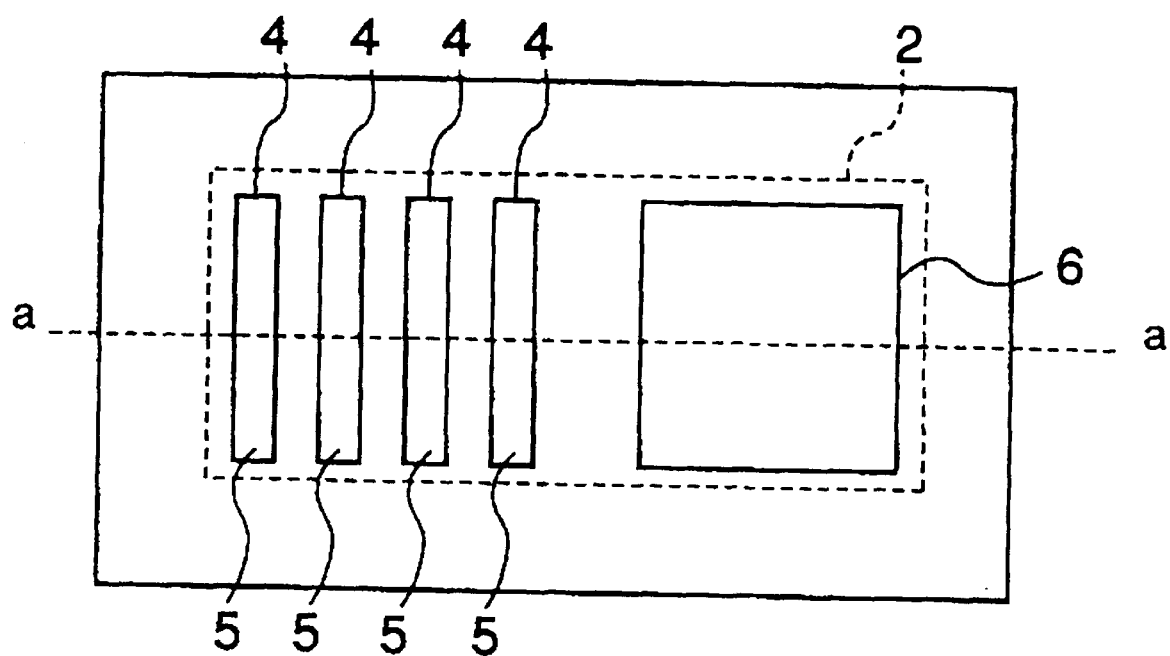
FIG. 3A is a fragmentary plane view illustrative of a semiconductor device having a novel emitter contact window structure in a first embodiment in accordance with the present invention.

FIRST EMBODIMENT:

A first embodiment according to the present invention will be described in detail with reference to FIGS. 3A and 3B, wherein there is provided a novel emitter contact window structure for a semiconductor device. A silicon substrate 1 has a check region "A" and a device region "B". FIGS. 3A and 3B both show check region "A" while FIGS. 4A and 4B both show the check region "A" and the device region "B". Base regions 2 are formed in selected upper regions of a silicon substrate 1 and on the check region "A" and the device region "B". An insulation film 3 is provided which extends over the silicon substrate 1 and the base regions 2. The insulation layer 3 has a set of plural emitter contact windows 4 on the check region "A" and a single emitter contact window on the device region "B". The insulation layer 3 also has a single base contact window 6 on the check region "A" and a single base region 2 on the device region "B". (FIG. 4A) Polysilicon films 5 doped with an impurity are provided to be filled within the emitter contact windows 4 formed on both the check region "A" and the device region "B". The polysilicon films 5 do not extend over the insulation film 3. The polysilicon films 5 have a top level which lies at the top surface level of the insulation layer 3. No polysilicon layer is formed in the base contact windows 6. Emitter regions 7 are formed in selected upper regions in the base regions 2 on both the check region "A" and the device region "B" so that the emitter regions 7 are in contact with the polysilicon films 5 filled within the emitter contact windows 4. The emitter contact windows 4 are in the form of slits or stripes which are arranged in parallel to each other and aligned in a direction perpendicular to the direction along which the individual slits or stripes extend. The base region 2 on the check region "A" has 50 micrometers squares. For example, a set of the emitter contact windows 4 may comprise 30 stripe-shaped windows which are arranged in parallel to each other and aligned in a direction perpendicular to the direction along which the individual stripes extend and at a pitch of 1.0 micrometer, wherein each of the stripe-shaped emitter contact windows has a length of 50 micrometers and a width of 0.6 micrometers. Normally, the probe has a contact top portion having a diameter in the range of about 0.5 millimeters to 1 millimeter, for which reason the contact top portion of the probe is necessarily made into contact with the polysilicon layers 5 within a large number of the emitter contact windows 4 in the insulation film 3. There is no possibility that the contact portion of the probe is not made into contact with any polysilicon layers 5 within the emitter contact windows 4. Namely, the above contact window structure allows a certain contact of the contact portion of the probe with the polysilicon layers 5 which are electrically connected to the emitter regions 7 through the emitter contact windows 4.

Fabrication processes for the above novel emitter contact window structure of the semiconductor device will be described with reference to FIGS. 4A through 4D.

Figure 4A:
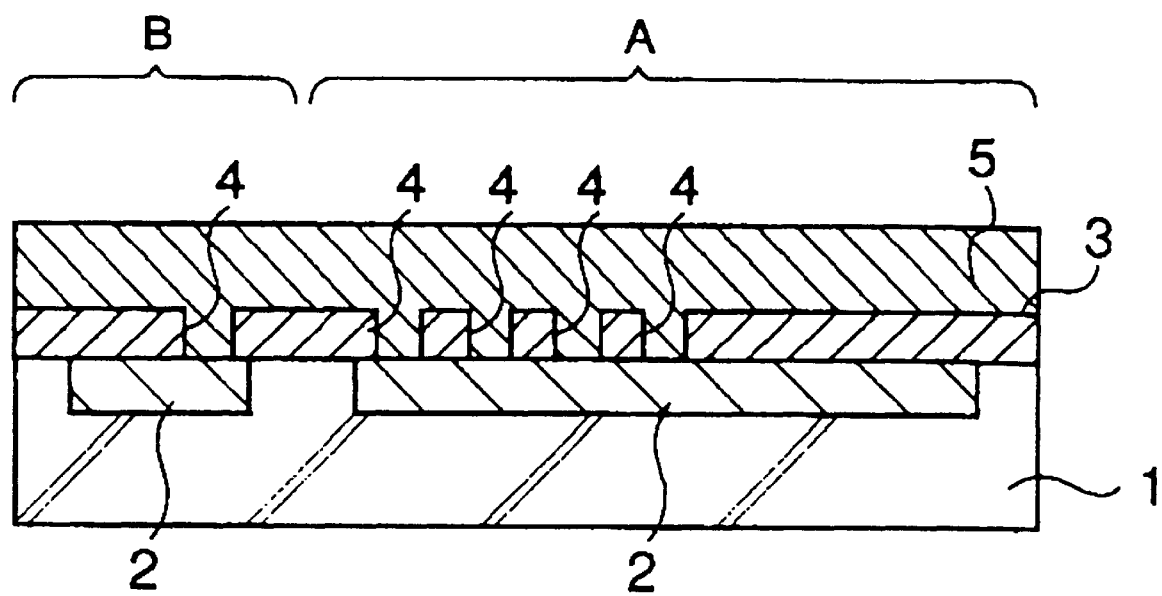
FIGS. 4A through 4D are fragmentary cross sectional elevation views illustrative of semiconductor devices with a novel emitter contact window structure in sequential steps involved in a conventional fabrication method in a first embodiment in accordance with the present invention.

With reference to FIG. 4A, base regions 2 are formed in selected upper portions of a silicon substrate 1 having a check region "A" and a device region "B" so that the base regions 2 are positioned on both the check region "A" and the device region "B". An insulation layer 3 is entirely formed over the silicon substrate 1 and the base regions 2 and also extends over the check region "A" and the device region "B". Emitter contact windows 4 are formed in the insulation film 3 so that one of the emitter contact windows 4 is positioned over the base region 2 on the device region "B" and a set of the remaining emitter contact windows 4 are positioned over the base region 2 on the check region "A". The emitter contact windows 4 positioned over the base region 2 on the check region "A" have the same width of the emitter contact window 4 over the base region 2 on the device region "B". The emitter contact windows 4 over the base region 2 on the check region "A" comprise stripe-shaped windows which are arranged in parallel to each other and aligned in a direction perpendicular to the direction along which the individual stripes extend and at a pitch of 1.0 micrometer, wherein each of the stripe-shaped emitter contact windows 4 has a length of 50 micrometers and a width of 0.6 micrometers. A polysilicon film 5 is formed over the insulation film 3 and also within the emitter contact windows 4 so that the polysilicon film 5 is in contact with the base region 2 on the device region "B" and also in contact with the base region 2 on the check region "A". The polysilicon film S is introduced with an impurity during the growth thereof.

Figure 4B:
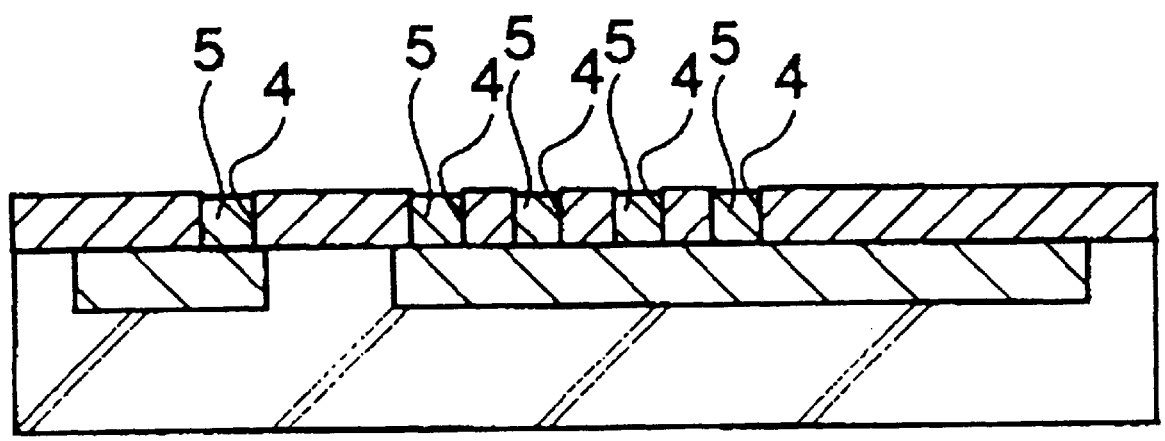

With reference to FIG. 4B, a reactive ion etching is carried out to selectively etch the impurity doped polysilicon film 5 so as to leave the impurity doped polysilicon film 5 only within the emitter contact windows 4 formed on the device region "B" and the check region "A".

Figure 4C:
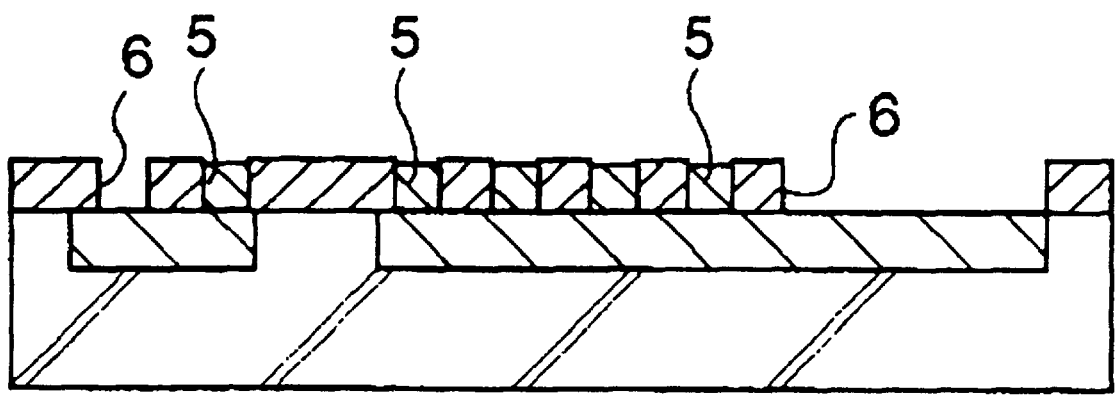

With reference to FIG. 4C, resin films not illustrated are formed on the insulation layer so that the resin films are positioned on the check region "A" and the device region "B", provided that the resin films are not cover any of the emitter contact windows 4. A reactive ion etching is carried out by use of the resin films as masks to selectively etch the insulation film 3 whereby base contact windows 6 are formed in the insulation layer 3. One of the base contact windows 6 is positioned over the base region 2 on the device region "B" and another base contact window 6 is positioned over the base region 2 on the check region "A".

Figure 4D:
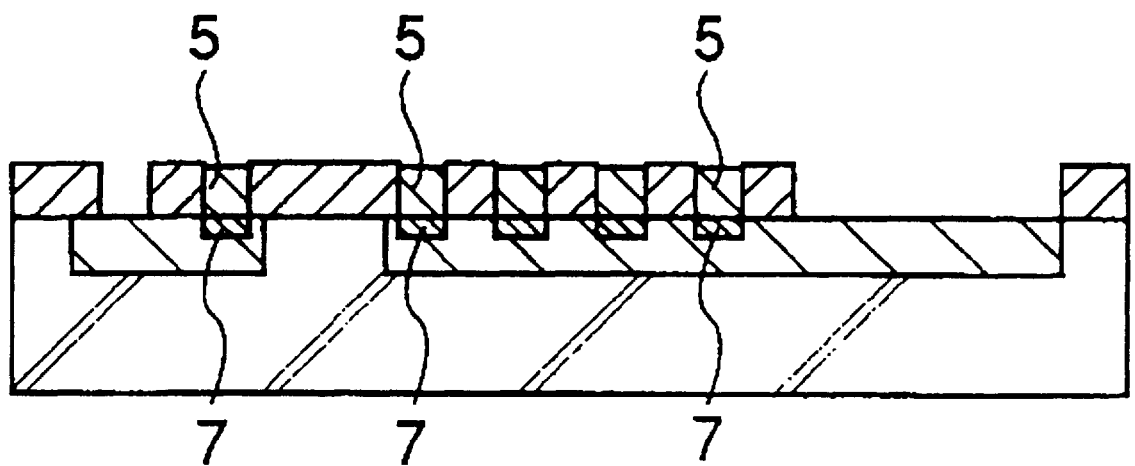

With reference to FIG. 4D, a heat treatment is carried out to the substrate 1 to cause a thermal diffusion of impurity from the polysilicon layers 5 within the emitter contact windows 4 into the base regions 2 on the device region "B" and the check region "A", whereby emitter regions 7 are formed in the upper regions of the base regions 2 on the device region "B" and the check region "A". The emitter regions 7 are positioned under the emitter contact windows 4 and have the same width as the emitter contact windows 4. Since the emitter contact windows 4 on the check region "A" have the same width of the emitter contact window 4 on the device region "B", the emitter regions 7 on the check region "A" has the same width as the emitter region 7 on the device region "B".

The above fabrication process is free of any additional process which is required for exclusively forming the check region. The emitter contact window structure in the check region is formed in the same processes for forming the device region.

Figure 5A:
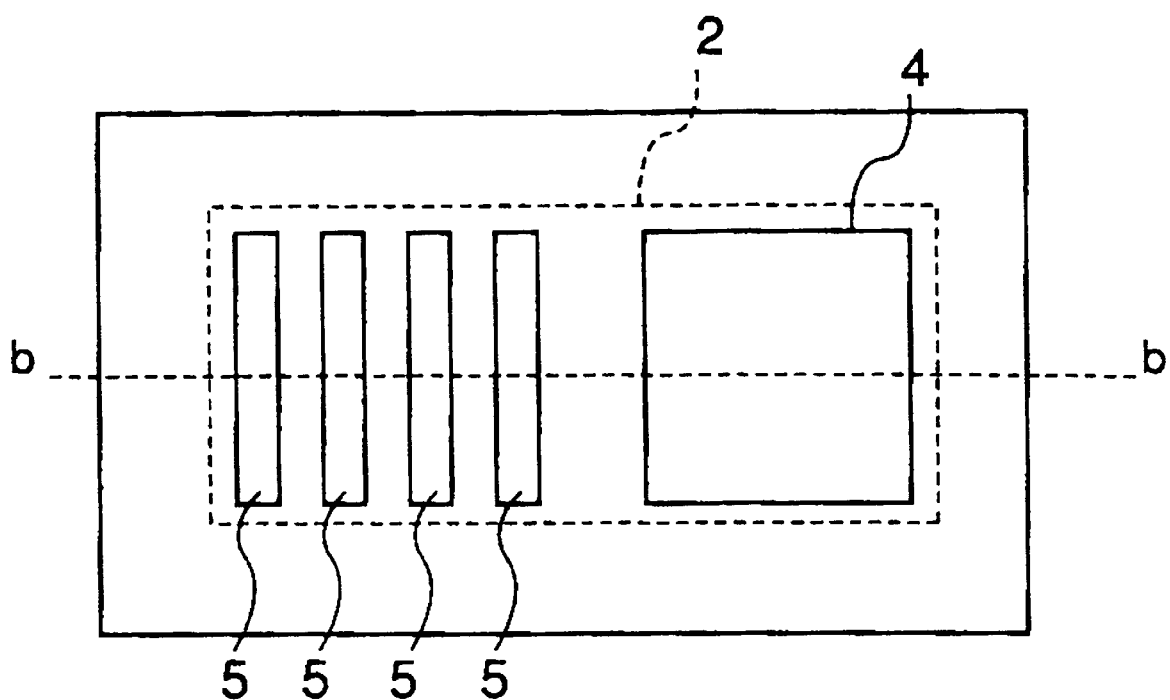
FIG. 5A is a fragmentary plane view illustrative of a semiconductor device having a novel emitter contact window structure in a second embodiment in accordance with the present invention.
Figure 5B:
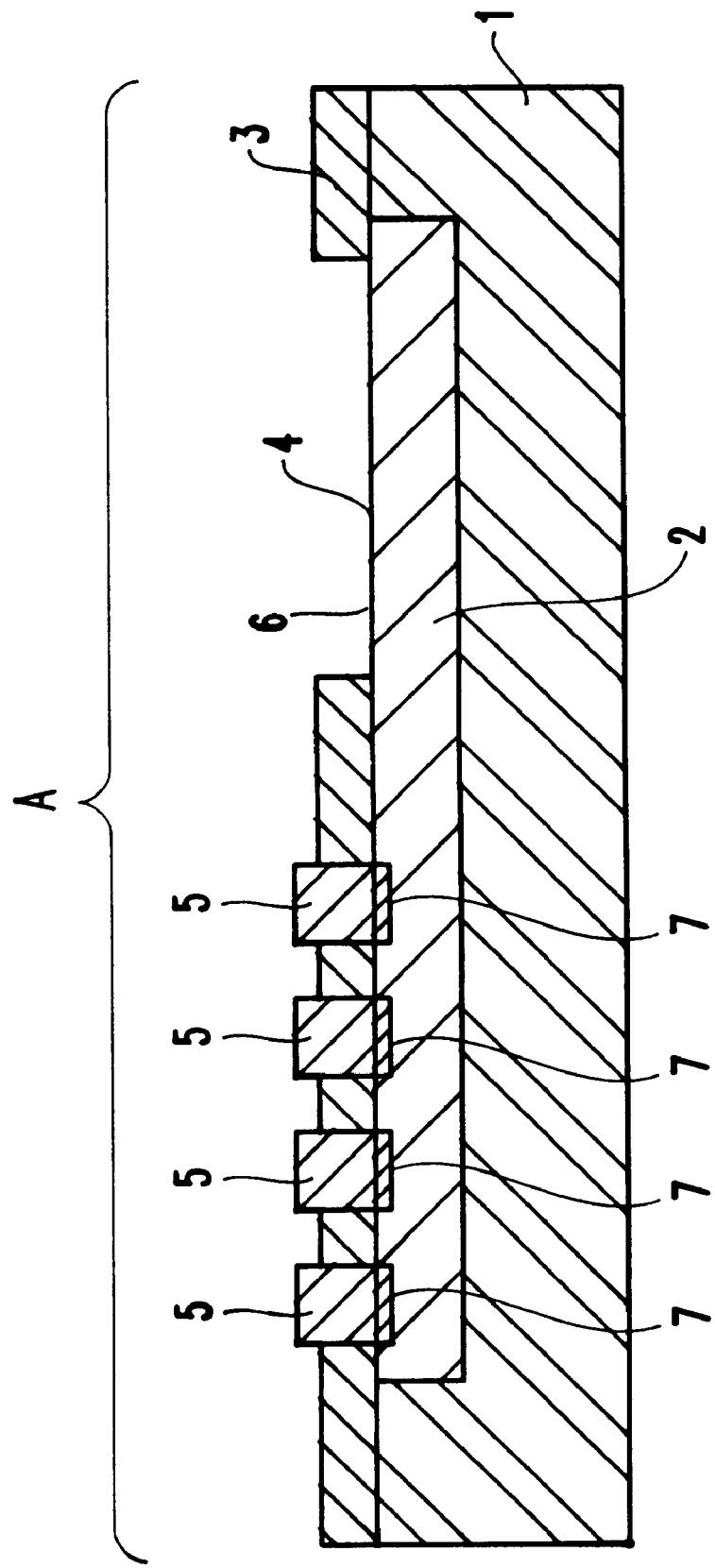
FIG. 5B is a fragmentary cross sectional elevation view illustrative of a semiconductor device having a novel emitter contact window structure taken along an "b—b" line of FIG. 5A.

SECOND EMBODIMENT:

A second embodiment according to the present invention will be described in detail with reference to FIGS. 5A and 5B, wherein there is provided a novel emitter contact window structure for a semiconductor device. A silicon substrate 1 has a check region "A" and a device region "B". FIGS. 5A and 5B both show check region "A". Base regions 2 are formed in selected upper regions of a silicon substrate 1 and on the check region "A" and the device region "B". An insulation film 3 is provided which extends over the silicon substrate 1 and the base regions 2. The insulation layer 3 has a set of plural emitter contact windows 4 on the check region "A" and a single emitter contact window on the device region "B". The insulation layer 3 also has a single base contact window 6 on the check region "A" and a single base region 2 on the device region "B". Polysilicon films 5 doped with an impurity are provided to be filled within the emitter contact windows 4 formed on both the check region "A" and the device region "B". The polysilicon films 5 do not extend over the insulation film 3. The polysilicon films 5 have a top level which lies over the top surface level of the insulation layer 3. Portions of the polysilicon layers 5 are higher than the top surface of the insulation film 3 but no polysilicon layer is formed in the base contact windows 6. Emitter regions 7 are formed in selected upper regions in the base regions 2 on both the check region "A" and the device region "B" so that the emitter regions 7 are in contact with the polysilicon films 5 filled within the emitter contact windows 4. The emitter contact windows 4 are in the form of slits or stripes which are arranged in parallel to each other and aligned in a direction perpendicular to the direction along which the individual slits or stripes extend. The base region 2 on the check region "A" has 50 micrometers squares. For example, a set of the emitter contact windows 4 may comprise 30 stripe-shaped windows which are arranged in parallel to each other and aligned in a direction perpendicular to the direction along which the individual stripes extend and at a pitch of 1.0 micrometers wherein each of the stripe-shaped emitter contact windows has a length of 50 micrometers and a width of 0.6 micrometers. Normally, the probe has a contact top portion having a diameter in the range of about 0.5 millimeters to 1 millimeter, for which reason the contact top portion of the probe is necessarily made into contact with the polysilicon layers 5 within a large number of the emitter contact windows 4 in the insulation film 3. There is no possibility that the contact portion of the probe is not made into contact with any polysilicon layers 5 within the emitter contact windows 4. Namely, the above contact window structure allows a certain contact of the contact portion of the probe with the polysilicon layers 5 which are electrically connected to the emitter regions. 7 through the emitter contact windows 4. Since the polysilicon layers 5 have a higher top level than the insulation film 3, the contact top portion of the probe is made into contact only with the polysilicon layers 5 but not contact with the insulation layer 3, for which reason a contact resistance is reduced by 20%.

Fabrication processes for the above novel emitter contact window structure of the semiconductor device will be described with reference to FIGS. 6A through 6D.

Figure 6A:
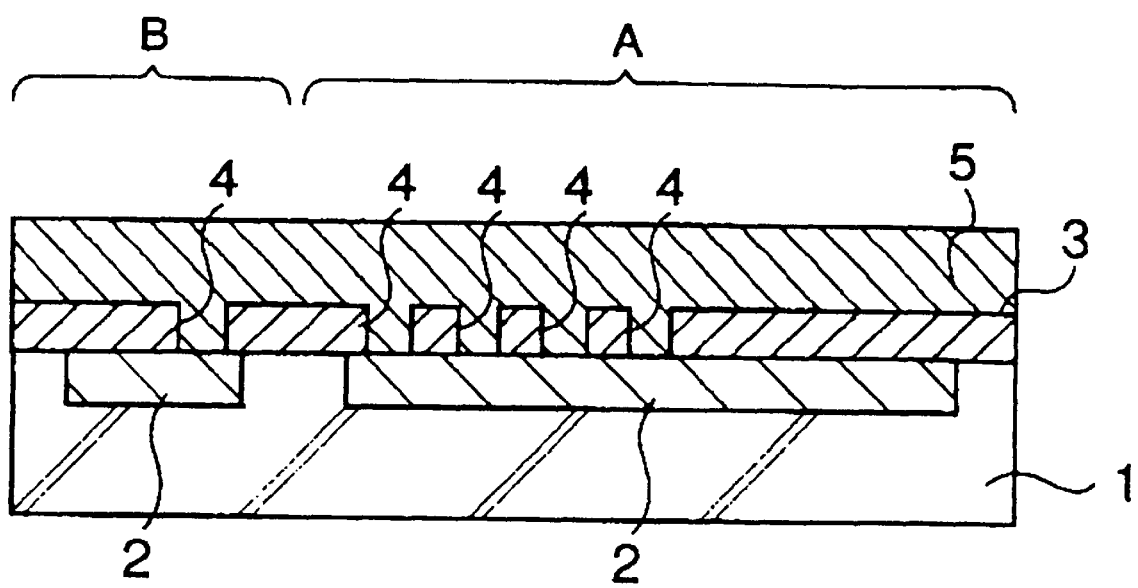
FIGS. 6A through 6D are fragmentary cross sectional elevation views illustrative of semiconductor devices with a novel emitter contact window structure in sequential steps involved in a conventional fabrication method in a second embodiment in accordance with the present invention.

With reference to FIG. 6A, base regions 2 are formed in selected upper portions of a silicon substrate 1 having a check region "A" and a device region "B" so that the base regions 2 are positioned on both the check region "A" and the device region "B". An insulation layer 3 is entirely formed over the silicon substrate 1 and the base regions 2 and also extends over the check region "A" and the device region "B". Emitter contact windows 4 are formed in the insulation film 3 so that one of the emitter contact windows 4 is positioned over the base region 2 on the device region "B" and a set of the remaining emitter contact windows 4 are positioned over the base region 2 on the check region "A". The emitter contact windows 4 positioned over the base region 2 on the check region "A" have the same width of the emitter contact window 4 over the base region 2 on the device region "B". The emitter contact windows 4 over the base region 2 on the check region "A" comprise stripe-shaped windows which are arranged in parallel to each other and aligned in a direction perpendicular to the direction along which the individual stripes extend and at a pitch of 1.0 micrometer, wherein each of the stripe-shaped emitter contact windows 4 has a length of 50 micrometers and a width of 0.6 micrometers. A polysilicon film 5 is formed over the insulation film 3 and also within the emitter contact windows 4 so that the polysilicon film 5 is in contact with the base region 2 on the device region "B" and also in contact with the base region 2 on the check region "A". The polysilicon film 5 is introduced with an impurity during the growth thereof.

Figure 6B:
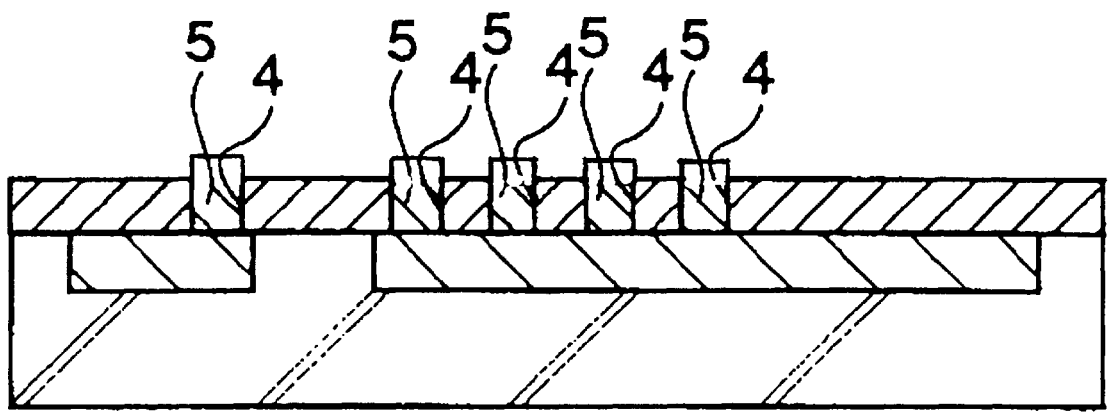

With reference to FIG. 6B, a reactive ion etching is carried out to selectively etch the impurity doped polysilicon film 5 so as to leave the impurity doped polysilicon film 5 only within the emitter contact windows 4 formed on the device region "B" and the check region "A". Subsequently, top surface portions of the insulation film 3 are etched so that top portions of the polysilicon films 5 are positioned over the etched surface of the insulation film 3. If the insulation film 3 is made of silicon oxide, then a fluorine acid solution is variable as an etchant.

Figure 6C:
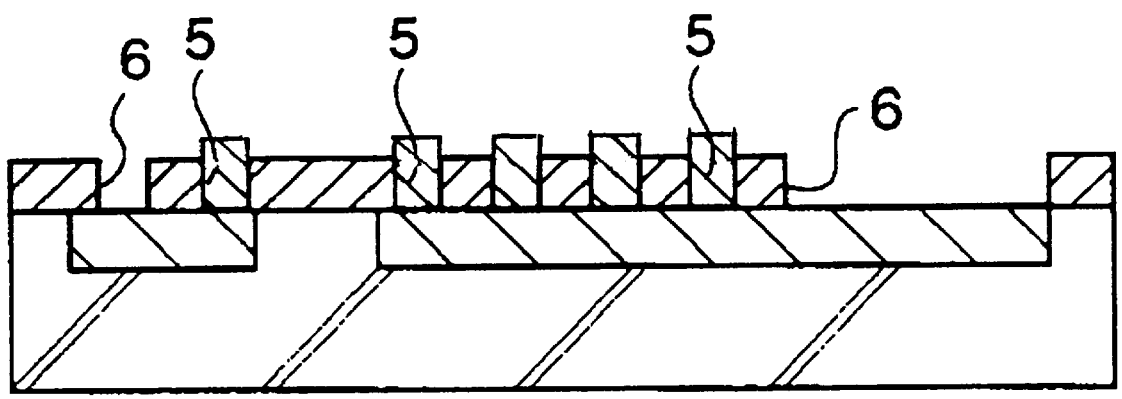

With reference to FIG. 6C, resin films not illustrated are formed on the insulation layer so that the resin films are positioned on the check region "A" and the device region "B", provided that the resin films are not cover any of the emitter contact windows 4. A reactive ion etching is carried out by use of the resin films as masks to selectively etch the insulation film 3 whereby base contact windows 6 are formed in the insulation layer 3. One of the base contact windows 6 is positioned over the base region 2 on the device region "B" and another base contact window 6 is positioned over the base region 2 on the check region "A".

Figure 6D:
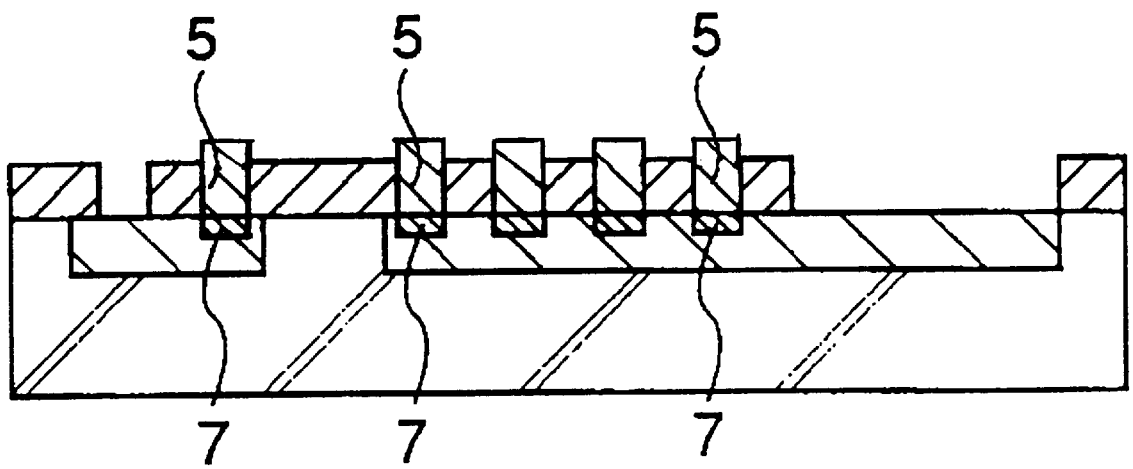

With reference to FIG. 6D, a heat treatment is carried out to the substrate 1 to cause a thermal diffusion of impurity from the polysilicon layers 5 within the emitter contact windows 4 into the base regions 2 on the device region "B" and the check region "A", whereby emitter regions 7 are formed in the upper regions of the base regions 2 on the device region "B" and the check region "A". The emitter regions 7 are positioned under the emitter contact windows 4 and have the same width as the emitter contact windows 4. Since the emitter contact windows 4 on the check region "A" have the same width of the emitter contact window 4 on the device region "B", the emitter regions 7 on the check region "A" has the same width as the emitter region 7 on the device region "B".

The above fabrication process is free of any additional process which is required for exclusively forming the check region. The emitter contact window structure in the check region is formed in the same processes for forming the device region.

Figure 7A:
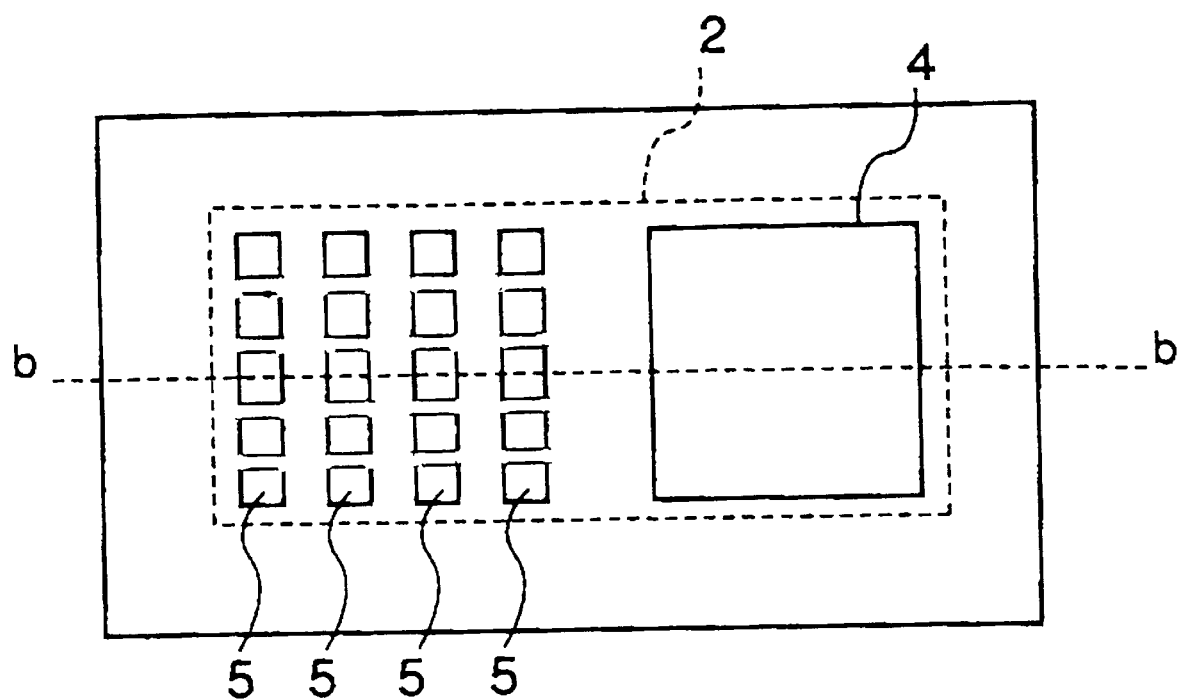
FIG. 7A is a fragmentary plane view illustrative of a semiconductor device having a novel emitter contact window structure in a third embodiment in accordance with the present invention.
Figure 7B:
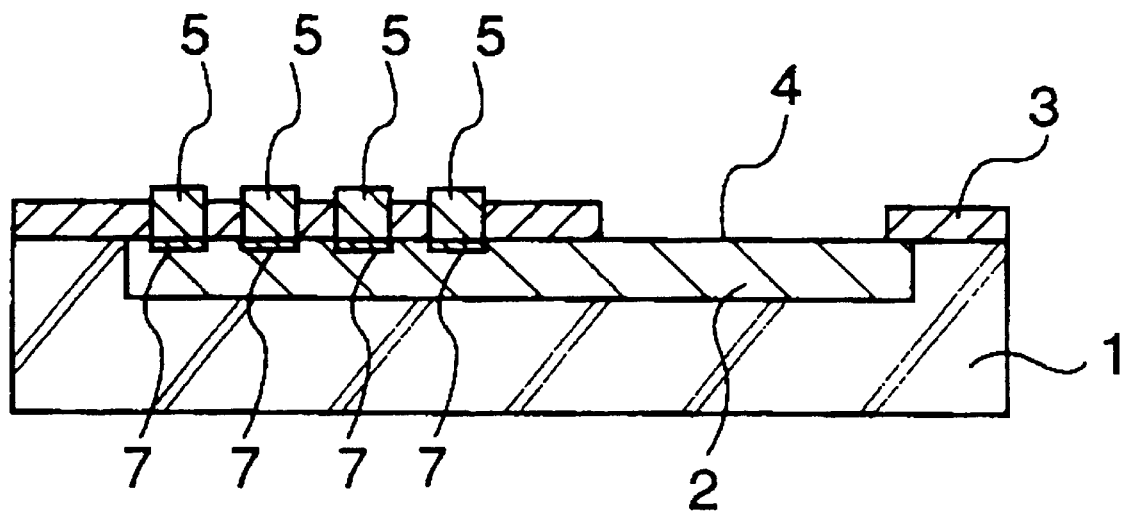
FIG. 7B is a fragmentary cross sectional elevation view illustrative of a semiconductor device having a novel emitter contact window structure taken along an "b—b" line of FIG. 6A.

THIRD EMBODIMENT:

A third embodiment according to the present invention will be described in detail with reference to FIGS. 7A and 7B, wherein there is provided a novel emitter contact window structure for a semiconductor device. A silicon substrate 1 has a check region "A" and a device region "B". Base regions 2 are formed in selected upper regions of a silicon substrate 1 and on the check region "A" and the device region "B". An insulation film 3 is provided which extends over the silicon substrate 1 and the base regions 2. The insulation layer 3 has a set of plural emitter contact windows 4 on the check region "A" and a single emitter contact window on the device region "B". The insulation layer 3 also has a single base contact window 6 on the check region "A" and a single base region 2 on the device region "B". Polysilicon films 5 doped with an impurity are provided to be filled within the emitter contact windows 4 formed on both the check region "A" and the device region "B". The polysilicon films 5 do not extend over the insulation film 3. The polysilicon films 5 have a top level which lies over the top surface level of the insulation layer 3. Portions of the polysilicon layers 5 are higher than the top surface of the insulation film 3 but no polysilicon layer is formed in the base contact windows 6. Emitter regions 7 are formed in selected upper regions in the base regions 2 on both the check region "A" and the device region "B" so that the emitter regions 7 are in contact with the polysilicon films 5 filled within the emitter contact windows 4. The emitter contact windows 4 are rectangular-shaped and aligned in matrix at a first pitch in a first direction and a second pitch in a second direction perpendicular to the first direction wherein the first and second pitches, for example, in the order of 1 micrometer are much smaller than the diameter of the top contact portion of the probe, so that the contact top portion of the probe is necessarily made into contact with the polysilicon layers 5 within a large number of the emitter contact windows 4 in the insulation film 3. There is no possibility that the contact portion of the probe is not made into contact with any polysilicon layers 5 within the emitter contact windows 4. Namely, the above contact window structure allows a certain contact of the contact portion of the probe with the polysilicon layers 5 which are electrically connected to the emitter regions 7 through the emitter contact windows 4. Since the polysilicon layers 5 have a higher top level than the insulation film 3, the contact top portion of the probe is made into contact only with the polysilicon layers 5 but not contact with the insulation layer 3, for which reason a contact resistance is reduced by 20%.

Fabrication processes for the above novel emitter contact window structure of the semiconductor device will be described with reference to FIGS. 8A through 8D.

Figure 8A:
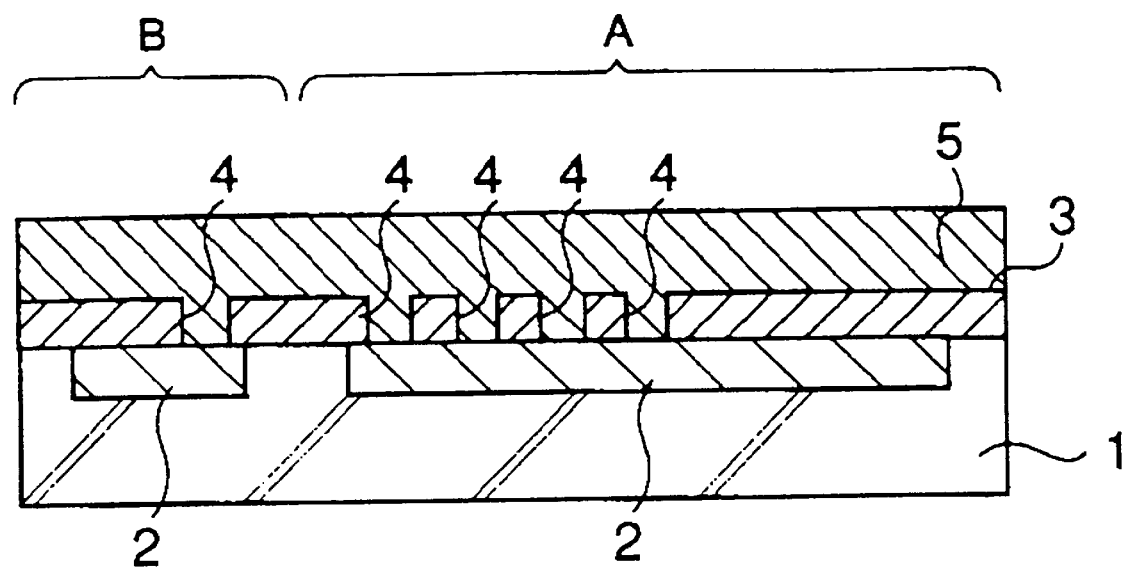
FIGS. 8A through 8D are fragmentary cross sectional elevation views illustrative of semiconductor devices with a novel emitter contact window structure in sequential steps involved in a conventional fabrication method in a second embodiment in accordance with the present invention.

With reference to FIG. 8A, base regions 2 are formed in selected upper portions of a silicon substrate 1 having a check region "A" and a device region "B" so that the base regions 2 are positioned on both the check region "A" and the device region "B". An insulation layer 3 is entirely formed over the silicon substrate 1 and the base regions 2 and also extends over the check region "A" and the device region "B". Emitter contact windows 4 are formed in the insulation film 3 so that one of the emitter contact windows 4 is positioned over the base region 2 on the device region "B" and a set of the remaining emitter contact windows 4 are positioned over the base region 2 on the check region "A". The emitter contact windows 4 positioned over the base region 2 on the check region "A" have the same width of the emitter contact window 4 over the base region 2 on the device region "B". The emitter contact windows 4 over the base region 2 on the check region "A" comprise rectangular-shaped windows which are aligned in matrix. A polysilicon film 5 is formed over the insulation film 3 and also within the emitter contact windows 4 so that the polysilicon film 5 is in contact with the base region 2 on the device region "B" and also in contact with the base region 2 on the check region "A". The polysilicon film 5 is introduced with an impurity during the growth thereof.

Figure 8B:
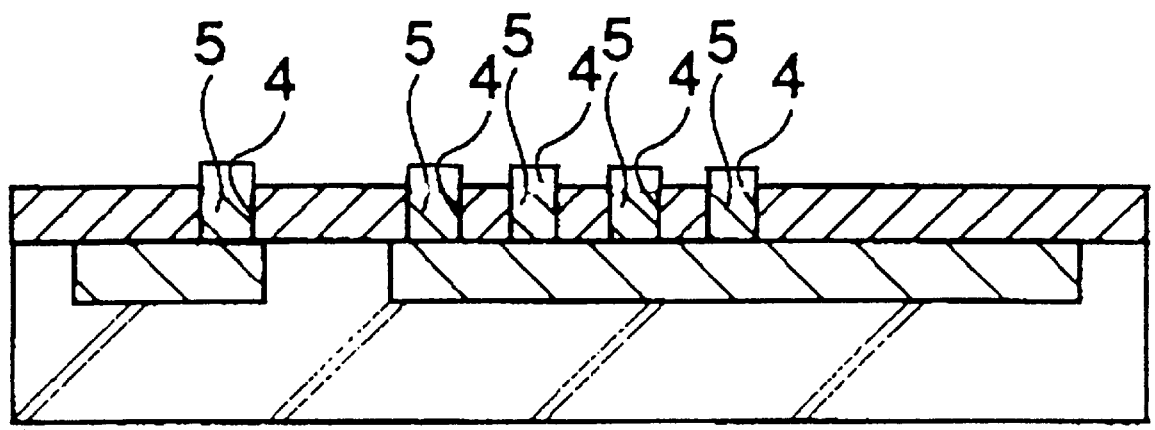

With reference to FIG. 8B, a reactive ion etching is carried out to selectively etch the impurity doped polysilicon film 5 so as to leave the impurity doped polysilicon film 5 only within the emitter contact windows 4 formed on the device region "B" and the check region "A". Subsequently, top surface portions of the insulation film 3 are etched so that top portions of the polysilicon films 5 are positioned over the etched surface of the insulation film 3. If the insulation film 3 is made of silicon oxide, then a fluorine acid solution is variable as an etchant.

Figure 8C:
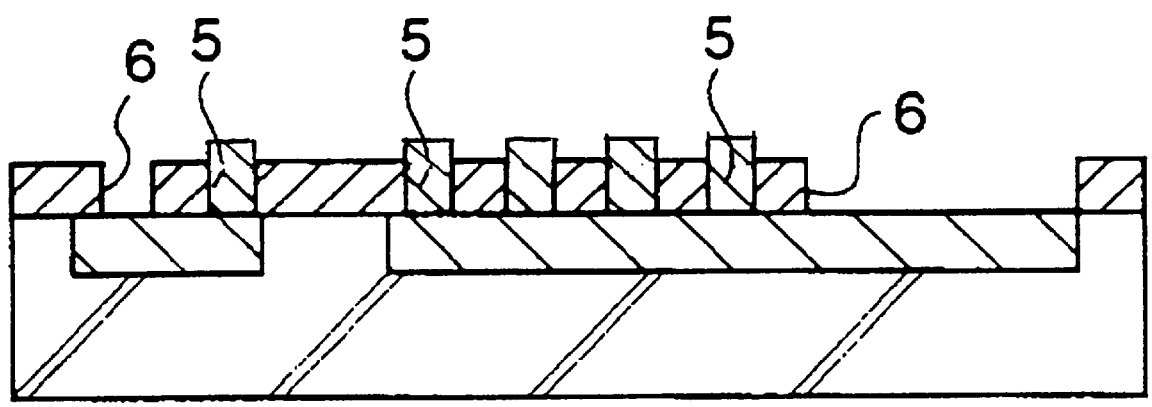

With reference to FIG. 8C, resin films not illustrated are formed on the insulation layer so that the resin films are positioned on the check region "A" and the device region "B", provided that the resin films are not cover any of the emitter contact windows 4. A reactive ion etching is carried out by use of the resin films as masks to selectively etch the insulation film 3 whereby base contact windows 6 are formed in the insulation layer 3. One of the base contact windows 6 is positioned over the base region 2 on the device region "B" and another base contact window 6 is positioned over the base region 2 on the check region "A".

Figure 8D:
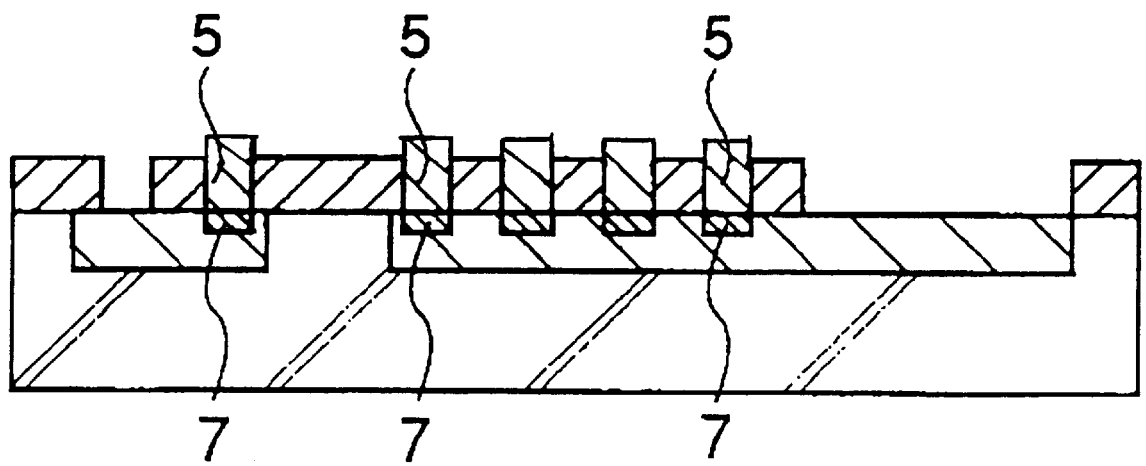

With reference to FIG. 8D, a heat treatment is carried out to the substrate 1 to cause a thermal diffusion of impurity from the polysilicon layers 5 within the emitter contact windows 4 into the base regions 2 on the device region "B" and the check region "A", whereby emitter regions 7 are formed in the upper regions of the base regions 2 on the device region "B" and the check region "A". The emitter regions 7 are positioned under the emitter contact windows 4 and have the same width as the emitter contact windows 4. Since the emitter contact windows 4 on the check region "A" have the same width of the emitter contact window 4 on the device region "B", the emitter regions 7 on the check region "A" has the same width as the emitter region 7 on the device region "B".

The above fabrication process is free of any additional process which is required for exclusively forming the check region. The emitter contact window structure in the check region is formed in the same processes for forming the device region.

As modification to the foregoing embodiments, the pitch and width of the emitter contact windows are allowed to be reduced as many as possible for satisfy the requirement of the scaling down of the semiconductor device and possible increase in the integration of the semiconductor device. Further, the shape and the number of the emitter contact windows may be changed.

The above prevent invention is also applicable to other semiconductor devices than the bipolar transistors.

Whereas any further modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A contact window structure having an insulation layer extending over an electrically conductive region, said insulation layer further having a plurality of contact windows which are filled with electrically conductive layers so that said electrically conductive layers are made into contact with said electrically conductive region, wherein adjacent two of said contact windows are distanced from each other by a pitch of not more than 1 micrometer and each of said contact windows has a size of not more than 0.6 micrometers.

2. The contact window structure as claimed in claim 1, wherein said contact windows are stripe-shaped.

3. The contact window structure as claimed in claim 1, wherein said contact windows are rectangular-shaped and aligned in matrix at first and second pitches along first and second directions which are perpendicular to each other and said first and second pitches.

4. The contact window structure as claimed in claim 1, wherein said contact windows are square-shaped and aligned in matrix at first and second pitches along first and second directions which are perpendicular to each other and said first and second pitches.

5. The contact window structure as claimed in claim 1, wherein said electrically conductive layers have a top level which lies substantially equal to or higher than a top level of said insulation layer.

6. The contact window structure as claimed in claim 1, wherein said electrically conductive layers comprise polysilicon layers.

7. The contact window structure as claimed in claim 1, wherein said electrically conductive layers comprise refractory metal layers.

8. The contact window structure as claimed in claim 1, wherein said electrically conductive region comprises a semiconductor diffusion region.

9. An emitter contact window structure having an insulation layer extending over a base region, said insulation layer further having a check region on which a plurality of emitter contact windows are formed, said emitter contact windows being filled with polysilicon layers so that said polysilicon layers are made into contact with said base region and said emitter regions are formed at upper portions of said base region in contact with said polysilicon layers, wherein adjacent two of said contact windows are distanced from each other by a pitch of not more than 1 micrometer and each of said contact windows has a size of not more than 0.6 micrometers.

10. The emitter contact window structure as claimed in claim 9, wherein said contact windows are stripe-shaped.

11. The emitter contact window structure as claimed in claim 9, wherein said contact windows are rectangular-shaped and aligned in matrix at first and second pitches along first and second directions which are perpendicular to each other and said first and second pitches.

12. The emitter contact window structure as claimed in claim 9, wherein said contact windows are square-shaped and aligned in matrix at first and second pitches along first and second directions which are perpendicular to each other and said first and second pitches.

13. The emitter contact window structure as claimed in claim 9, wherein said electrically conductive layers have a top level which lies substantially equal to or higher than a top level of said insulation layer.

14. A semiconductor device comprising:

a substrate;

a base region selectively formed in said substrate;

an insulation layer extending over said substrate and said base region, said insulation layer having a check region which includes a plurality of emitter contact windows;

polysilicon layers filled within said emitter contact windows so that said polysilicon layers are made into contact with said base region; and emitter regions formed in said base region so that said emitter regions are made into contact with said polysilicon layers within said emitter contact windows, wherein adjacent two of said emitter contact windows are distanced from each other by a pitch of not more than 1 micrometer and each of said contact windows has a size of not more than 0.6 micrometers.

15. The semiconductor device as claimed in claim 14, wherein said contact windows are stripe-shaped.

16. The semiconductor device as claimed in claim 14, wherein said contact windows are rectangular-shaped and aligned in matrix at first and second pitches along first and second directions which are perpendicular to each other and said first and second pitches.

17. The semiconductor device as claimed in claim 14, wherein said contact windows are square-shaped and aligned in matrix at first and second pitches along first and second directions which are perpendicular to each other and said first and second pitches.

18. The semiconductor device as claimed in claim 14, wherein said electrically conductive layers have a top level which lies substantially equal to or higher than a top level of said insulation layer.

* * * * *